ALIGNMENT DEVICE FOR SEMICONDUCTOR APPARATUS

Filed Aug. 27, 1965

3 Sheets-Sheet 1

INVENTOR
Richard P. Bywaters
BY René E. Grossman
ATTORNEY

April 23, 1968 R. P. BYWATERS 3,379,938

ALIGNMENT DEVICE FOR SEMICONDUCTOR APPARATUS

Filed Aug. 27, 1965 3 Sheets-Sheet 2

INVENTOR
Richard P. Bywaters

BY René E. Grossman

ATTORNEY

April 23, 1968 R. P. BYWATERS 3,379,938

ALIGNMENT DEVICE FOR SEMICONDUCTOR APPARATUS

Filed Aug. 27, 1965 3 Sheets-Sheet 3

INVENTOR
Richard P. Bywaters
BY René E. Grossman
ATTORNEY 3,379,938
ALIGNMENT DEVICE FOR SEMICONDUCTOR APPARATUS Richard P. Bywaters, Dallas, Tex., assignor to Texas Instruments Incorporated, Dallas, Tex., a corporation of Delaware Filed Aug. 27, 1965, Ser. No. 483,269
8 Claims. (Cl. 317—101)

ABSTRACT OF THE DISCLOSURE

An alignment device is disclosed for aligning semiconductor networks to a printed circuit board. The alignment device comprises an alignment frame having alternate arrays of ribs and hollow bays with the ribs having a groove running longitudinally to accommodate the semiconductor networks. The ribs further include slots which hold in alignment the leads of the semiconductor networks. A pressure plate is used to insure contact between the network leads and the etch pads of the printed circuit board.

Figure 1:
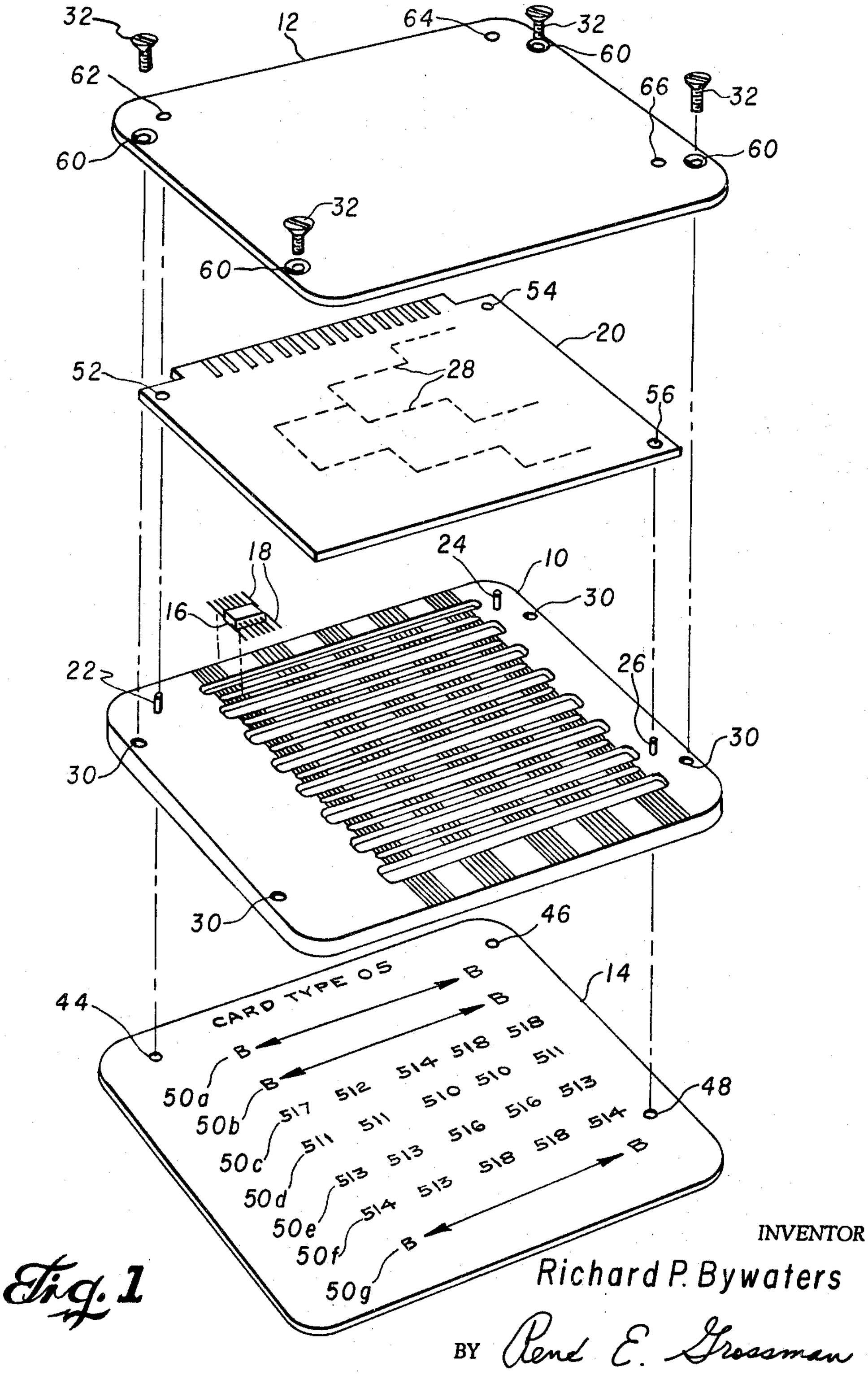

This invention relates to the alignment of semiconductor devices and more particularly to an apparatus by which the alignment is effected.

Because of the microminiaturization of circuits into semiconductor networks, connection of the networks' leads to a printed circuit board by welding or soldering presents a major problem. This problem manifests itself by inefficient production rates from welding operators who weld these semiconductor networks to printed circuit boards. Typically, a welding operator uses the following sequence: (1) refers to an assembly drawing and then moves the networks from a storage bin to each location on the printed circuit board indicated by the drawing; (2) moves the networks and the board to the welding position underneath the welding electrodes, and (3) aligns the electrodes to each of the network leads and welds them to the etched circuitry of the board.

From the above sequence, it should be noted that a large percentage of the welding operator's time is spent handling the semiconductor networks. To eliminate this waste of time, the device of the present invention is devised to hold networks in a fixed position relative to the printed circuit board. Such a device permits a support assembler to perform the handling task away from the welding station, while allowing the welding operator to perform only the third step of the above sequence. Thus the support assembler can load the device while networks are being welded in another device. When a welding operation is completed, the card assembly is removed from the device and the empty device returned to the support assembler for reloading.

It is therefore an object of the present invention to provide a device for aligning and holding a plurality of semiconductor networks to a printed circuit board, whereby welding or soldering operations may be performed on the networks and thereby effect an increase in production rates.

Another object of the invention is to provide an alignment device which automatically aligns the semiconductor networks to the etch on the printed circuit board.

A further object of the invention is to provide an alignment device which enables a welding operator to perform a welding operation on the aligned semiconductor networks and printed circuit board without removing the networks and board from the device.

Another object of the invention is to provide a device which allows ready access to the semiconductor networks' leads and the etch on the printed circuit board in order to interconnect the networks by welding or soldering the leads to the etch on the circuit board.

A further object is to provide a device which can be used in assemblying different printed circuit configurations with only minor changes in device construction.

A still further object is to provide an alignment device that undergoes little or no wear during its use.

Figures 2, 3, 4, 5:
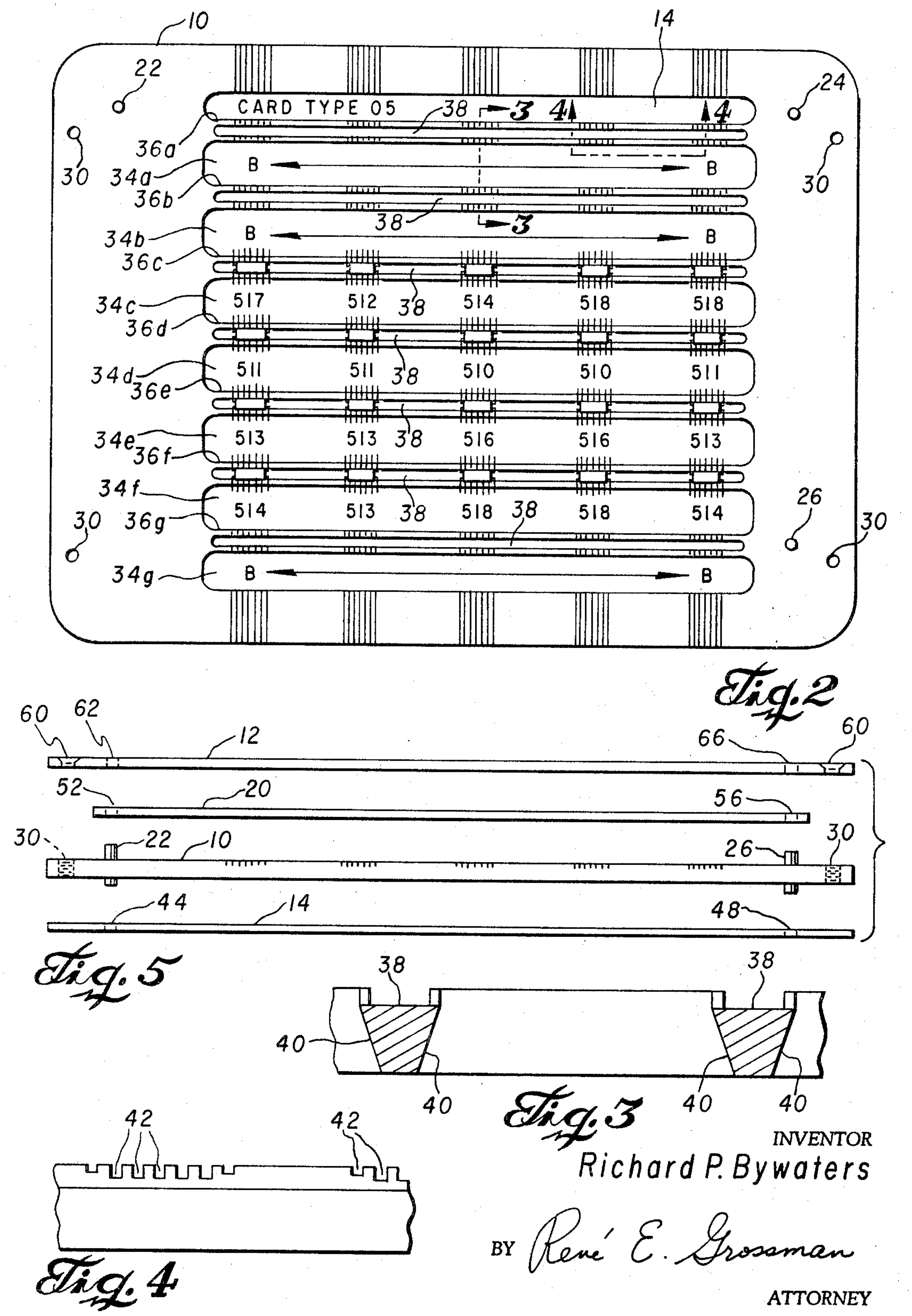

For a more complete understanding of the present invention and for further objects and advantages thereof. reference may be had to the following description taken in conjunction with the appended claims and accompanying drawings in which:

FIGURE 1 is a perspective exploded view of the alignment device comprising the pressure plate, the alignment frame and the assembly template, and including the printed circuit board, FIGURE 2 is an enlarged plan view of the alignment frame shown in FIGURE 1, loaded with semiconductor networks in accordance with the markings on the assembly template.

Figure 6:
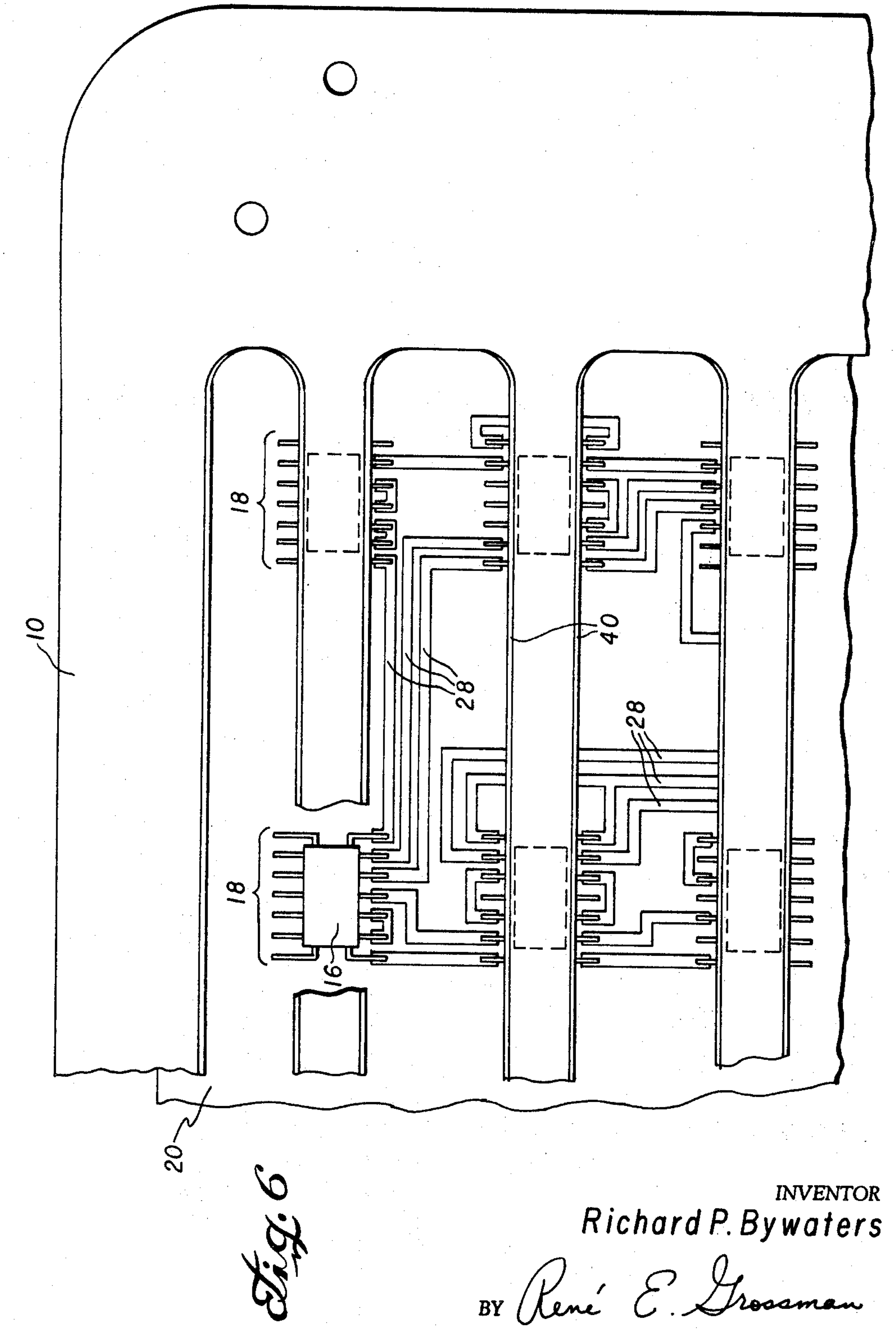

FIGURE 3 is a partial sectional view of FIGURE 2 taken along the section line 3—3 in FIGURE 2, FIGURE 4 is a partial sectional view of FIGURE 2 taken along the section line 4—4 in FIGURE 2, FIGURE 5 is an end view of the alignment device shown in FIGURE 1, with the elements thereof separated for a clearer showing, FIGURE 6 is a partial exploded view of the reverse side of the alignment frame of FIGURE 2 with the semiconductor networks and printed circuit board affixed thereto.

Referring now to FIGURE 1, the basic parts of the device are illustrated in perspective to show the relationship between them and the cooperation therebetween. The device between them and the cooperation therebetween. The device essentially comprises three parts; namely, the alignment frame 10, the pressure plate 12, and the assembly template 14. A semiconductor network 16 having leads 18 extending therefrom representative of those that are to be attached by welding or soldering to printed circuit board 20 is also shown.

The main part of the device, namely, the alignment frame 10, is shown in more detail in the enlarged view of FIGURE 2 with the assembly template 14 positioned on the under side of the frame. The alignment frame 10 is of rectangular shape and made of aluminum or other suitable metal. Three guide pins, 22, 24 and 26 are mounted in the alignment frame, extend through the printed circuit board 20 through holes 52, 54 and 56, respectively, and further extend into, but not through, the pressure plate 12 in holes 62, 64 and 66, respectively, and the assembly template 14 in holes 44, 46 and 48, respectively. This feature can be more clearly seen in FIGURE 5 which shows an end view of FIGURE 1, with the parts 12, 20, 10 and 14 close together in aligned relation, but still spaced apart to indicate the alignment of the guide pins (only pins 22 and 26 being shown) with the associated registering holes. The guide pins 22, 24 and 26 are arranged in a pattern that allows placement of the printed circuit board 20, pressure plate 12 and assembly template 14 in but one position in respect to the alignment frame 10. Thus correct arrangement of the parts of the device is assured. The guide pins 22, 24 and 26 also perform the additional function of aligning the etch pads 28 on the printed circuit board 20 with the leads 18 of the electrical networks 16. This alignment is shown in FIGURE 6.

Referring again to FIGURE 1, four threaded holes 30 are located at the corners of the alignment frame 10. By means of screws 32 passing through registering holes 60 in the pressure plate 12 and threading through the holes 30 in the alignment frame 10, the circuit board 20 is sandwiched between the plate and the frame, the whole assembly being clamped together as a unit. It should be noted that the assembly template 14 is then brought into registry with the unit by the guide pins 22, 24 and 26 of the frame entering the holes 44, 46 and 48, respectively, in the template.

Referring to FIGURE 2, the alignment frame 10 is further comprised of alternate sequence of hollow bays 34*a*–34*g* and ribs 36*a*–36*g*. FIGURE 3 represents the cross-sectional view of the ribs cut by section line 3—3 in FIGURE 2. Each rib has a groove 38 along its center line which holds the electrical networks captive in the transverse direction. The sides 40 of the ribs are slanted with respect to a vertical reference at an appropriate angle (approximately 19°) to allow slanted electrodes to parallel-gap weld or solder with a minimum of lead length the leads of the networks which are placed in grooves 38.

FIGURE 4 shows in cross-section a portion of FIGURE 2 along the section line 4—4. The slots 42 are cut across the width of the alignment frame and hold each electrical network captive in the longitudinal direction. The outer slots are cut shallow to compensate for the lower flexural strength of the corresponding four outer leads of the semiconductor network.

Referring again to FIGURE 1, assembly template 14 has essentially the same dimensions as the alignment frame 10. Three holes 44, 46 and 48 are cut in said template to accommodate the guide pins 22, 24 and 26, as previously described. The assembly template 14 is also comprised of a series of symbolization markers 50*a*–50*g* which designate which electrical network is to be placed in the appropriate slot of the alignment frame. The "B" marked on the assembly template designates that that particular slot is to remain "Blank."

A separate assembly template 14 is necessary for each printed circuit board type. It is believed evident that assembly template 14 eliminates the need for referring to an assembly print while loading the alignment device, since the symbolization markers for the different networks going into the various grooves 38 of the alignment frame 10 are visible through the corresponding adjacent bays 34*a*–34*g*, as shown in FIGURE 2.

As previously described, printed circuit board 20 has three holes 52, 54 and 56 at three corners, as shown, to accommodate the guide pins 22, 24 and 26, respectively. The pins extend through the board and align the board in such a manner that the etch pads 28 on said board will exactly overlay the leads 18 of the electrical networks 16 in the alignment frame 10. This alignment capability can be seen more readily in FIGURE 6 which shows a portion of the reverse side of alignment frame 10 with the semiconductor network leads 18 resting in the slots 42 shown in FIGURE 4. The slots in the frame are so designed that when the leads 18 are placed therein and the printed circuit board 20 is placed on the frame, the etch pads 28 will exactly overlay and be aligned with the leads 18 for subsequent welding or soldering operations.

Pressure plate 12 is of the same general external configuration as the assembly template 14. This plate has four countersunk holes 60 for the accommodation of screws 32 which, threading through the holes 30 in the alignment frame, clamp the plate, the frame and the printed circuit board into a unit. As previously stated, the three holes 62, 64 and 66 are used to align the pressure plate with the alignment frame by means of the guide pins 22, 24 and 26, respectively.

In operation, the alignment device of the present invention is used in the following sequence: The appropriate assembly template 14 (depending upon the printed circuit board to be built) is placed under the alignment frame 10 and positioned in registry therewith by the guide pins 22, 24 and 26 extending from the frame, as shown in FIGURE 5. When this step is performed, row 50*a* of symbolization markers on the assembly template 14 will appear in the hollow bay 34*a* of alignment frame 10, row 50*b* will appear in bay 34*b*, 50*c* in 34*c* down to 50*g* in 34*g*, respectively (as shown in FIGURE 2). This will result in the symbolization markers on the assembly template being positioned between the frame ribs 36*a*–36*g* on the alignment frame to appear just below its proper network location. Accordingly, it is possible for a support assembler, when bringing the two parts of the device together (that is, the alignment frame 10 and the assembly template 14) to load the alignment frame with the required semiconductor networks without referring to an assembly drawing.

The next step in using the alignment device is to load the networks face down (such as network 16 shown in FIGURE 1) in the grooved ribs 38 on the alignment frame in accordance with the symbolization markers shown on the assembly template. Each network is placed just above the corresponding network type symbolization marker on the assembly template 14. The printed circuit board 20 (corresponding to the assembly type template used) is aligned by the guide pins 22, 24 and 26 on the frame and placed on top of the networks with the component side of said board placed downward. With the completion of this step, the leads 18 of the networks in the alignment frame will be properly aligned with the etch pads 28 on the component side of the printed circuit board 20 (as shown in FIGURE 6).

The next step involved in using the alignment device is to place the pressure plate 12 on top of the printed circuit board 20 and align it with the alignment frame 10 by fitting the alignment holes 62, 64 and 66 over the guide pins 22, 24 and 26, respectively. The alignment frame 10 and the pressure plate 12 are then fastened together by means of the screws 32 through the holes 60 in the pressure plate, the screws threading into holes 30 of the alignment frame 10, as before-described. The pressure plate thereby presses into more intimate contact the semiconductor network leads to the etch pads of the printed circuit board.

The assembly template 14 may then be removed and the assembled device inverted to expose all of the network leads properly aligned to the printer circuit board 20 ready for the rapid welding or soldering of the network conductors to the etch pads on the circuit board.

Although the present invention has been shown and illustrated in terms of a specific apparatus, it will be apparent that changes or modifications can be made without departing from the spirit and scope of the invention as defined by the appended claims.

What is claimed is:

1. A device for holding a semiconductor network and aligning its leads to the etch pads of a printed circuit board, comprising:

(a) an alignment frame, a semiconductor network and a printed circuit board, (b) means on said frame for holding said semiconductor network in a predetermined manner, (c) means on said frame for affixing said circuit board to said frame in a predetermined manner with respect to said frame and aligning the etch pads of said board over the leads of said network, and (d) pressure means attached to said frame to produce contact between said network leads and the etch pads of said printed circuit board.

2. A device for holding a plurality of semiconductor networks and aligning their leads to the etch pads of a printed circuit board, comprising:

(a) an alignment frame, a plurality of semiconductor networks and a printed circuit board, (b) means on said frame including a grooved rib running longitudinally to accommodate said networks, said rib having a pluralty of transversely aligned slot uniformly spaced therealong to severaly hold the leads of said networks in alignment, and (c) means on said frame for affixing said printed circuit board in a predetermined manner with respect to said frame, whereby the etch pads on said board severally overlie and are severally aligned with the leads of said semiconductor networks.

3. A device according to claim 2 including a pressure plate having means to secure said plate to said frame, thereby to produce contact between the network leads and the etch pads of said printed circuit board.

4. A device for holding a plurality of semiconductor networks and align their leads to the etch pads of a printed circuit board, comprising:

(a) an alignment frame having a network side, a plurality of semiconductor networks, and a printed circuit board, (b) means on said frame including a grooved rib running longitudinally to accommodate each of said networks, said rib having a plurality of transversely aligned slots uniformly spaced therealong to hold oppositely connected leads of each of said networks in alignment, (c) an assembly template disposed opposite the network side of said frame, said template having symbolization markings thereupon indicative of the predetermined location of each semiconductor network on said frame, and (d) means on said frame for affixing the printed circuit board in a predetermined manner with respect to said frame, whereby the etch pads on said board severally overlie and are severally aligned with the leads of said semiconductor networks.

5. A device for holding a plurality of semiconductor networks and aligning their leads to the etch pads of a printed circuit board, comprising:

(a) an alignment frame, a plurality of semiconductor networks, and a printed circuit board, (b) means on said frame including an alternate array of ribs and hollow bays, said ribs each having a groove running longitudinally to accommodate a plurality of said networks and having a plurality of transversely aligned slots uniformly spaced therealong to hold oppositely connected leads of each of said networks in alignment, and (c) means on said frame for affixing said printed circuit board in a predetermined manner with respect to said frame, whereby the etch pads on said board severally overlie and are severally aligned with the leads of said semiconductor networks.

6. A device according to claim 5 including a pressure plate having means to secure said plate to said frame, thereby to press into contact the network leads and the etch pads of said printed circuit board.

7. A device for holding a plurality of semiconductor networks and their leads to the etch pads of the printed circuit board, comprising:

(a) an alignment frame having a network side, (b) a pluarlity of semiconductor networks, (c) a printed circuit, (d) a first means on said frame for holding said networks in a predetermined manner, (e) an assembly template disposed opposite the network side of said frame, said template having symbolization markings thereupon indicative of the predetermined location of each of said semiconductor networks on said frame, said markings being visible from the network side of said frame, and (f) a second means on said frame for affixing said printed circuit board in a predetermined manner with respect to said frame, whereby the etch pads on said board severally overlie and are severally aligned with the leads of said semiconductor networks.

8. A device for holding a plurality of semiconductor networks and aligning their leads to the etch pads of the printed circuit board, comprising:

(a) an alignment frame having a network side, (b) semiconductor networks, (c) a printed circuit board, (d) means on said frame including alternate arrays of ribs and hollow bays, each of said ribs having a groove running longitudinally to accommodate a plurality of said semiconductor networks and having a plurality of transversely aligned slots uniformly spaced therealong to hold oppositely connected leads of each semiconductor network in alignment, (e) an assembly template disposed opposite the network side of said frame, said template having symbolization markings thereupon indicative of the predetermined location of each of said semiconductor networks on said frame, said markings being visible through the hollow bays of said alignment frame, (f) means on said frame for affixing said printed circiut board in a predetermined manner with respect to said frame, whereby the etch pads on said printed circuit board severally overlie and engage the leads of said semiconductor networks, and (g) a pressure plate having means to secure said plate to said frame to obtain contact between the network leads and the etch pads of said printed circiut board.

References Cited

UNITED STATES PATENTS 3,323,023 5/1967 Walker.

ROBERT K. SCHAEFER, *Primary Examiner.*

J. R. SCOTT, *Assistant Examiner.*